(12) United States Patent
Graetzel et al.

(10) Patent No.: US 7,042,029 B2
(45) Date of Patent: May 9, 2006

(54) SOLID STATE HETEROJUNCTION AND SOLID STATE SENSITIZED PHOTOVOLTAIC CELL

(75) Inventors: Michael Graetzel, St-Sulpice (CH); Robert Plass, Lausanne (CH); Udo Bach, Hilzingen (CH)

(73) Assignee: Ecole Polytechnique Federale de Lausanne (EPFL), Lausanne (CH)

( * ) Notice: Subject to any disclaimer, the term of this patent is extended or adjusted under 35 U.S.C. 154(b) by 0 days.

(21) Appl. No.: 10/885,224

(22) Filed: Jul. 6, 2004

(65) Prior Publication Data

US 2005/0006714 A1 Jan. 13, 2005

Related U.S. Application Data

(63) Continuation-in-part of application No. 09/918,115, filed on Jul. 30, 2001, now Pat. No. 6,861,722.

(30) Foreign Application Priority Data

Jul. 28, 2000 (EP) ................................. 00810681

(51) Int. Cl.
*H01L 31/328* (2006.01)
*H01L 31/06* (2006.01)

(52) U.S. Cl. ...................... 257/184; 257/431; 257/436; 257/461

(58) Field of Classification Search .................. 257/21, 257/184, 431, 436, 437, 461
See application file for complete search history.

(56) References Cited

U.S. PATENT DOCUMENTS

| 5,482,570 | A | 1/1996 | Saurer et al. |
| 5,525,440 | A | 6/1996 | Kay et al. |
| 5,885,368 | A | 3/1999 | Lupo et al. |
| 6,335,481 | B1 | 1/2002 | Watanabe |
| 6,359,211 | B1* | 3/2002 | Spitler et al. ............... 136/263 |
| 6,861,722 | B1* | 3/2005 | Graetzel et al. ............ 257/461 |
| 2004/0250848 | A1* | 12/2004 | Sager et al. ................ 136/252 |

FOREIGN PATENT DOCUMENTS

DE   19711713 A1   10/1998

OTHER PUBLICATIONS

Vogel, et al., *Sensitization of highly porous, polycrystalline $TiO_2$ electrodes by quantum sized CdS*, Chemical Physics Letters, Nov. 9, 1990, pp. 241-246, vol. 174, No. 3, 4, Elsevier Science.

(Continued)

*Primary Examiner*—T. N. Quach
(74) *Attorney, Agent, or Firm*—Clifford W. Browning; Woodard, Emhardt, Moriarty, McNett & Henry LLP

(57) ABSTRACT

A solid state p-n heterojunction comprising an electron conductor and a hole conductor; it further comprises a sensitising semiconductor, said sensitizing semiconductor being located at an interface between said electron conductor and said hole conductor. In particular, the sensitizing semiconductor is in form of quantum-dots. A solid state sensitized photovoltaic cell comprises such a heterojunction between two electrodes.

23 Claims, 3 Drawing Sheets

OTHER PUBLICATIONS

O'Regan, et al. *A low-cost, high-efficiency solar cell based on dye-sensitized colloidal $TiO_2$ films*, Letters to Nature, Oct. 24, 1991, vol. 353.

Vogel, et al., *Quantum-Sized PbS, CdS, $Ag_2S$, $Sb_2S_3$, and Bi2S3 Particles as Sensitizers for Various Nanoporous Wide-Bandgap Semiconductors*, J. Phys. Chem., 1994, pp. 3183-2188, vol. 98.

Greenham, et al., *Charge separation and transport in conjugated-polymer/semiconductor-nanocrystal composites. . .*, Physical Review B., Dec. 15, 1996, pp. 628-637, vol. 54, No. 24.

Siebenstritt et al., *CdTe and CdS and Extremely Thin Absorber Materials in an ETA solar cell*, 14th European Photovoltaic Solar Energy Conference, Jun. 30, 1997, pp. 1823-1826, Barcelona, Spain.

Salafsky, et al., *Photoinduced charge spearation and recombination in a conjugated polymer-semiconductor nanocrystal composite*, Chemical Physics Letters, Jul. 3, 1998, pp. 297-303, vol. 290, No. 4/06.

Rost, et al., *Transparent P-Type Semiconductors for the eta Solar Cell . . .*, 2nd World Conf. And Exh. On Photovoltaic Solar Energy Conversion, Jul. 6-10, 1998, pp. 212-215, Vienna, Austria.

Bach, et al., *Solid-state dye-sensitized mesoporous $TiO_2$ solar cells . . .*, Letters to Nature, Oct. 8, 1998, pp. 583-585, vol. 395, MacMillan Journals Ltd., London.

Moller, et al., *A novel disposition technique for compound semiconductors on highly porous substrate: ILGAR*, Thin Solid Films, Feb. 21, 2000, pp. 113-117, vol. 361/362, Elsevier-Sequoia.

Bach, U., *Solid-State Dye-Sensitized Mesoporous $TiO_2$ Solar Cells*, Thesis presented to Ecole Polytechnique Federale de Lausanne, 2000, Lausanne, Switzerland.

Thelakkat, et al., *Poly(triarylamine)s-synthesis and application in electroluminescent devices and photovoltaics*, Synthetic-Metals (Switzerland), vol. 102, No. 1-3, pp. 1125-1128, Jun., 1999.

* cited by examiner

- - Treated 1x (Integrated current from 340 to 800 is 1.4mA/cm$^2$)
—— Treated 5x (Integrated current from 340 to 800 is 2.0mA/cm$^2$)
····· Treated 10x (Integrated current from 340 to 800 is 1.1 mA/cm$^2$)

SOLID STATE HETEROJUNCTION AND SOLID STATE SENSITIZED PHOTOVOLTAIC CELL

CROSS-REFERENCE TO RELATED APPLICATIONS

This application is a continuation-in part of application Ser. No. 09/918 115, filed Jul. 30, 2001, now U.S. Pat. No. 6,861,722 B2

BACKGROUND OF THE INVENTION

1. Field of the Invention

The present invention concerns a solid state p-n heterojunction, comprising an electron conductor, i.e. an n-type semiconductor, and a hole conductor, i.e. an p-type semiconductor. The invention concerns also a solid state sensitized photovoltaic cell, in particular a solar cell.

2. Description of Related Art

The dye sensitized solar cells (DSSC), are more and more maturing into a technically and economically credible alternative to the conventional p-n junction photovoltaics. Photoelectrochemical (PEC) liquid junction cells based on the photosensitization of nanocrystalline $TiO_2$ semiconductor layers with molecular sensitizers attracted renewed interest after Grätzel et al reported energy conversion efficiencies >10%, in Nature, 353 (1991) 737. The nanocrystalline semiconductor network forming a mesoporous structure, characterized by its high surface area, has several design functions: it provides the surface for the sensitizer adsorption, it accepts the electrons from the light-excited dye and finally it conducts the injected electrons to the working electrode.

In 1998, Grätzel et al reported in Nature, 395 (1998) 583, a more innovative all solid state cell based on a heterojunction sensitized by a molecular dye where an amorphous organic hole transport material replaced the liquid electrolyte.

The crucial part in these cells is the dye itself. Only a very limited number of dyes give high photocurrent quantum yields and are reasonably stable against photo-degradation. Some of the organic dyes exhibiting high light absorption are sensitive to air and water.

Siebentritt et al (14th European Photovoltaic Solar Energy Conference, 1997) proposed to provide porous $TiO_2$ layers with thin films of a light absorber material, e.g. CdS films, or CdTe films with thicknesses of about 100 nm. The film forming material is deposited either by electrodeposition or by chemical bath deposition. Depending upon the type of $TiO_2$ material (spray-pyrolysed or screen-printed), the absorber material film grows substantially on top of the $TiO_2$ layer, where no external limitation to the particle size exists, or penetrates into the structure, filling up the pores. According to the teaching of Siebentritt et al, an annealing step, increasing the size of crystallites within the films, improves the photoresponse. But one has to consider though that this teaching represents only "half" a solar cell with no p-type semiconductor being present.

BRIEF SUMMARY OF THE INVENTION

The present inventors have found that deposition of a sufficient amount of absorber material and further annealing treatment for forming continuous films at the surface of an n-type semiconductor albeit increasing the light absorption and enhancing the spectral response of the absorber/n-type semiconductor junction, but also obstruct the permeation of the mesoporous structure by the p-type semiconductor, and so the charge transport decreases.

It is therefore a target of the present invention to propose photovoltaic cells having improved stability against photo-degradation and environmental influences. It is another target of the invention to achieve higher photocurrent quantum yields, higher photovoltages and hence higher conversion yields in the visible part of the light spectrum.

These aims are achieved by means of a first object of the invention, namely a solid state p-n heterojunction consisting of an n-type semiconductor in the solid state, a p-type semiconductor in the solid state and a sensitizing semiconductor, said n-type semiconductor having a mesoporous structure, said sensitizing semiconductor consisting of individual particles adsorbed at the surface of said n-type semiconductor, said individual particles being quantum dots, wherein the average size of said individual particles is smaller than the average pore size of said mesoporous structure.

Thereby, a further object of the present invention is a new embodiment of a solid state sensitized solar cell where the molecular sensitizing dye is replaced by small individual semiconductor particles, namely quantum dots.

For the purpose of sensitization, the sensitizing semiconductor shall be light absorbing in the visible and the near infrared parts of the light spectrum, preferably up to 950 nanometers (eq to 1.4 eV).

According to the invention, the sensitizing semiconductor is provided in form of individual particles adsorbed at the surface of the electron conductor. The term "individual particles" herein refers to particles of various sizes, below a nanometer, in the nanometer range (1–10 nm), or slightly bigger, but excludes single discrete molecules on one hand and larger clusters and continuous film portions on the other hand.

According to the invention, the average size of the sensitizing particles shall be smaller than the average size of the pores of the mesoporous structure formed by the n-type semiconductor material. Thereby, after formation of the sensitizing semiconductor/n-type semiconductor junction, the p-type semiconductor may penetrate into the pores and fill the major portion or substantially all the remaining space, thus constituting the heterojunction according to the invention.

In view of a use with afore-mentioned mesoporous $TiO_2$ structures, average particle sizes of the sensitizing particles of between 1 and 20 nm are preferred. Particularly preferred are particle sizes of between 1 and 10 nm.

A preferred kind of particles of sensitizing semiconductor for providing a solid state p-n heterojunction according to the present invention are quantum-dots.

Quantum dots, also referred to in scientific papers as "nano-dot" or "Q-dot", are semiconductor particles of a few nanometer size, wherein a gradual translation from solid state to molecular structure occurs as the particle size decreases. In a variety of materials, size quantization effects, like an increase of the electronic band gap from the bulk value, may appear if the particle size is below 20 nm. As quantum dots, particles consisting of CdS, $Bi_2S_3$, $Sb_2S_3$, or $Ag_2S$ may be used, whereas PbS is preferred. Other compounds suitable for making quantum-dots are In As, InP, CdTe, CdSe, HgTe. Solid solutions of HgTe and CdTe or of HgSe and CdSe are also suitable. The quantum dots are adsorbed at the surface of the n-type semiconductor where each dot forms a kind of point-contact junction with the n-type semiconductor. Almost all quantum dots form also a kind of point-contact junction with the p-type semiconductor material.

To achieve an efficient electron injection into the n-type semiconductor, the energy level of the sensitizer excited state should be higher than the energy of the lower edge of the conduction band of the n-type semiconductor. In other words, the oxidation potential of the sensitizer excited state has to be more negative than the oxidation potential of the n-type semiconductor, e.g. $TiO_2$. On the other hand, the energy level of the oxidised sensitizer has to be lower than the energy level of the reduced hole conductor to ensure an efficient regeneration of the sensitizer. In case where a large Q-dot or an even larger particle, is adsorbed on the n-type semiconductor, its band gap is rather small due to weak quantum confinement. The energy of the photogenerated electron in this particle is weaker than the energy of the lower edge of the semiconductor conduction band, and thus the driving force for the injection into the semiconductor is too weak to induce efficiently this process. However, when the Q-dot is smaller, the energy of the photogenerated electron is greater than that of the LUMO of the semiconductor, and thus the electron rapidly tunnels to the n-type semiconductor. Size quantization effects are generally more pronounced in the particle size range 1 to 10 nm, and thus quantum dots in the size range 1 to 10 nm are preferred.

Preferably, the n-type semiconductor is a finely divided and sintered large band gap ceramic oxide. Various metal oxides like $Ta_2O_5$, $Nb_2O_5$, $SnO_2$, ZnO may be used as solid electronic conductors, whereas nanocrystalline $TiO_2$ (anatase) is preferred.

The hole conductor may be selected from hole transporting inorganic solids like copper iodide or copper thiocyanate. Typically, the hole conductor may be an organic charge transport material. This organic charge transport material may be a polymer, like poly-tiophen or poly-arylamin. The hole conductor of the present invention may also be an amorphous, reversibly oxidizable organic non-polymeric compound.

As such a compound, the hole conductor may be selected from the group consisting of spiro- and hetero spiro compounds of general formula (I)

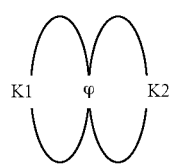
(I)

wherein φ is one of C, Si, Ge or Sn, and K1 and K2 are, independently one of the other, conjugated systems. A particularly preferred hole conductor is 2,2', 7,7'-tetrakis (N,N-di-p-methoxyphenyl-amine) 9,9'-spirobifluorene, herein further called OMeTAD.

A preferred quantum dot sensitized nanocrystalline heterojunction is constituted of sintered particles of nanocrystalline $TiO_2$ onto which PbS particles in the nanometer range are adsorbed as sensitizers, the pores between the particles being filed with amorphous OMeTAD.

The mesoscopic nature of the heterojunction results in a high contact area of the junction, which is prerequisite for efficient solar light harvesting by the quantum dots. Light is absorbed by the Q-dots and produces electron-hole pairs. The electrons are injected from the Q-dots into the electron conducting solid while the holes are injected in the hole conducting side of the junction. In this way electric power is produced from light.

While the sensitization of oxide semiconductors by Q-dots has already been reported for liquid junction cells by Vogel et al, in Chem. Phys. Lett., 174 (1990) 241, these devices show notorious problems with corrosion and photocorrosion of the Q-dots by the electrolyte, rendering them unsuitable for sensitization. The present invention realises a solid state heterojunction cell that does not present these disadvantages and hence can be used for the conversion of sunlight to electric power.

Quantum dot sensitized heterojunction cells offer several advantages. The band gaps and thereby the absorption ranges are adjustable through the particle size or by adjusting the relative concentrations of components in solid solutions like HgTe/CdTe or HgSe/CdSe. The band gap of these solutions may be adjusted to approach the optimal value for conversion of sunlight to electric power, which is about 1.4–1.5 eV.

Furthermore, compared to organic dyes, quantum dot sensitization offers improved stability, since the surface of the Q-dots can be modified to improve their photostability.

Another advantage is that the optical cross section of the Q-dots is significantly larger than the one of the molecular dyes. This allows to employ thinner electron conductor films resulting in higher photovoltages as well as better fill factors of the cell, and hence higher conversion yields. Whereas only a limited number of molecular dyes suit the requirements of DSSC, Q-dot semiconductors have very high extinction coefficients and hence are very effective sensitizers. Since photo generated $e^-$ and $h^+$ can be separated effectively as in n-p junctions, quantum dot sensitization offers a means to combine the mechanical features, efficiency and weather-ruggedness of single crystalline or polycrystalline p-n photovoltaics with an excellent spectral range coverage.

BRIEF DESCRIPTION OF THE DRAWINGS

Other features and advantages of the present invention will appear to those skilled in the art from the following description of an embodiment of a solid state sensitized photovoltaic cell, from the description of a process for making a solid state heterojunction and from measurements made with such a cell, in conjunction with the drawings, among which.

DETAILED DESCRIPTION OF THE INVENTION.

Figure 1:
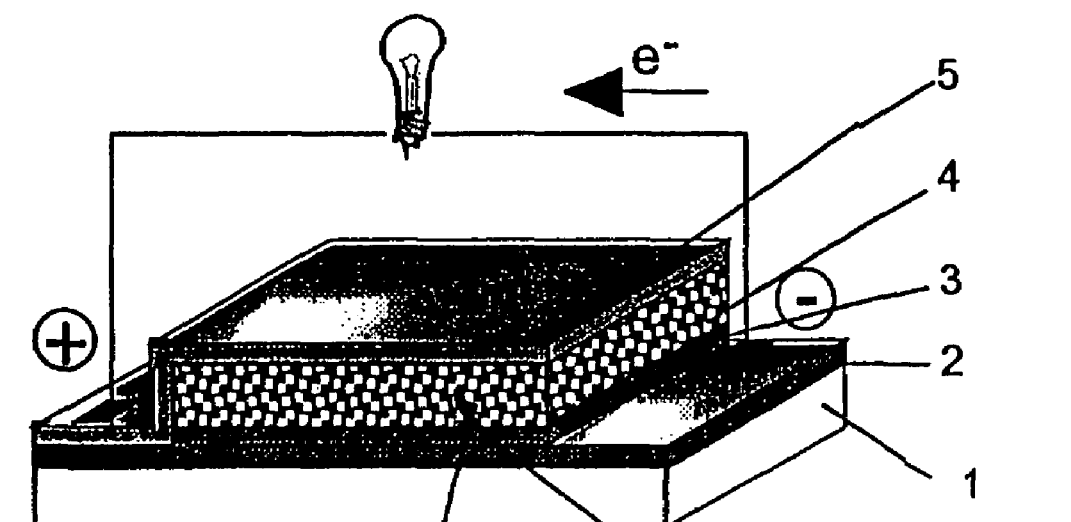
FIG. 1 shows a schematic view of a solid state sensitized photovoltaic cell.

FIG. 1 shows the schematic build up of a solid state sensitized photovoltaic cell. From bottom to top there are:
an ITO transparent glass support 1;
the glass support 1 is coated by a transparent conducting layer 2 made of F doped $SnO_2$, thereby the coated glass acts as a working electrode, which collects charge and current.

a dense TiO$_2$ layer 3 for avoiding direct contact between the organic hole conductor and the SnO$_2$, which would short circuit the cell;

a quantum dot sensitized nanocrystalline layer 4, forming a heterojunction, which is build up as will be explained bellow;

the back contact 5 of the cell is made of a fine gold layer of 10 nanometers covered by a thick nickel layer for a better current collection.

Figure 2:
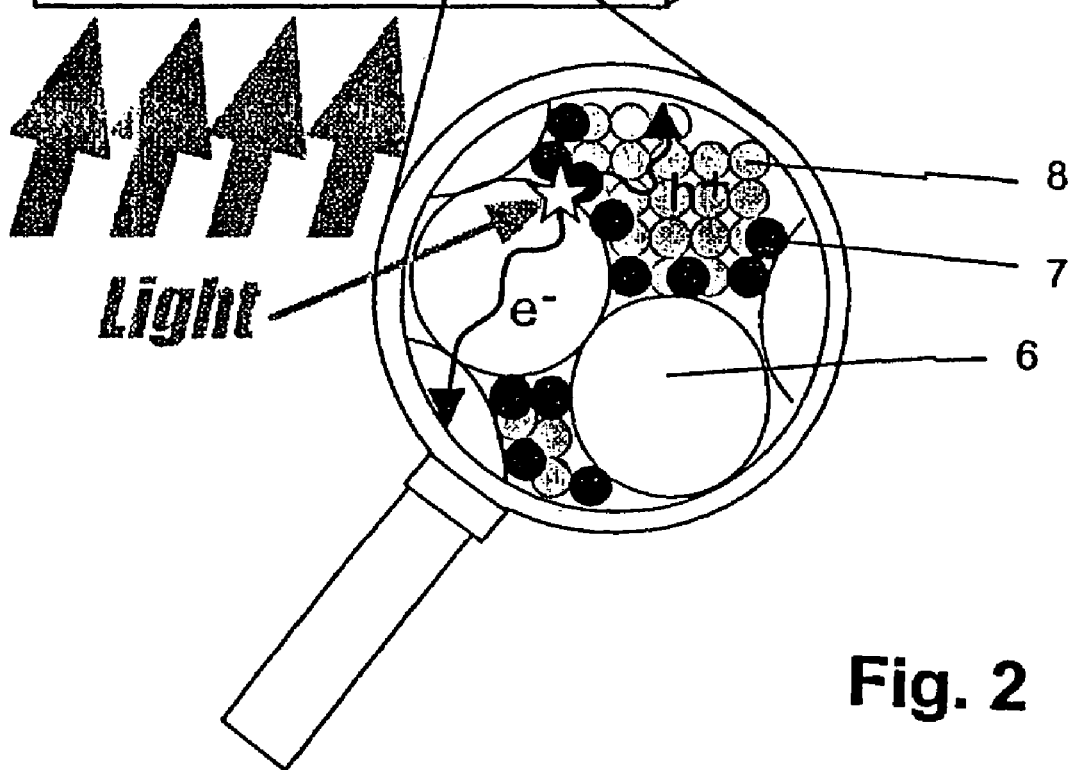
FIG. 2 is an enlarged view of a heterojunction within the nanocrystalline $TiO_2$ layer.

FIG. 2 shows a magnified schematic view of the microscopic structure of the p-n heterojunction: at the surface of TiO$_2$ particles 6, are adsorbed Q-dots 7; the spaces are filled with particles 8 of an organic hole conductor.

EXAMPLE

Process for Making a Solid State p-n Heterojunction

The compact TiO$_2$ layer is deposited on the SnO$_2$-coated glass by spray pyrolysis. This process is performed following the procedure described in the thesis No. 2187 at EPFL (Ecole Polytechnique Fédérale de Lausanne) of Udo Bach. The nanoporous TiO$_2$ layer is deposited by screen printing. The plates are thereafter sintered at a temperature of 450° C. for 15 min. This results in a layer with a thickness of about 2 μm. The mesoporous structure of layer 4 is constituted of aggregated TiO$_2$ anatase particles having average sizes of between 10 nm and 450 nm. As reported by Gratzel et al in J. Am. Ceram. Soc. 80, 3157 (1997), the average pore size of these mesoporous structures depends primarily on the aforementioned aggregated particle size, but also on operative conditions, in particular the heat treatment. The average pore size may be thus tuned to values of between 4–20 nm. In case of addition of up to 30% organic binder before the heat treatment, that disappears upon firing at 450°, the average pore size may be increased to about 30 to 40 nm. For reasons of diffusion kinetics and permeation by the p-type semiconductor on one hand and surface area of the mesoporous structure on the other hand, pore sizes of about 20 nm to 40 nm are preferred. The plates are thereafter stored in water free atmosphere.

The technique used to deposit the Q-dots follows the procedure published by Weller et al in J. Phys. Chem. 98, 1994, 3183. Two solutions are needed for this technique, the first one is a saturated Pb (NO$_3$)$_2$ solution in water, and the second one a 0.3 M Na$_2$S solution in water. The plates are immersed for 1 minute in the first solution. Thereafter, they are rinsed with water and dipped into the second solution for about 10 sec and then rinsed again. This deposition procedure may be repeated several times.

After the deposition of the Q-dots, the hole-conductor is introduced into the pores of the nanocrystalline structure by spin-coating. The spin-coating solution is a 30% by weight solution of OMeTAD in chlorobenzene. The OMeTAD may be doped with 0.2% of OMeTAD$^-$. An amount of 15 μl of spin-coating solution is used for each plate. Subsequently, the solvent is evaporated.

A semi-transparent gold back contact is evaporated on top of the heterojunction layer under vacuum. A second contact layer made of nickel is sprayed onto the first one.

Figure 3:
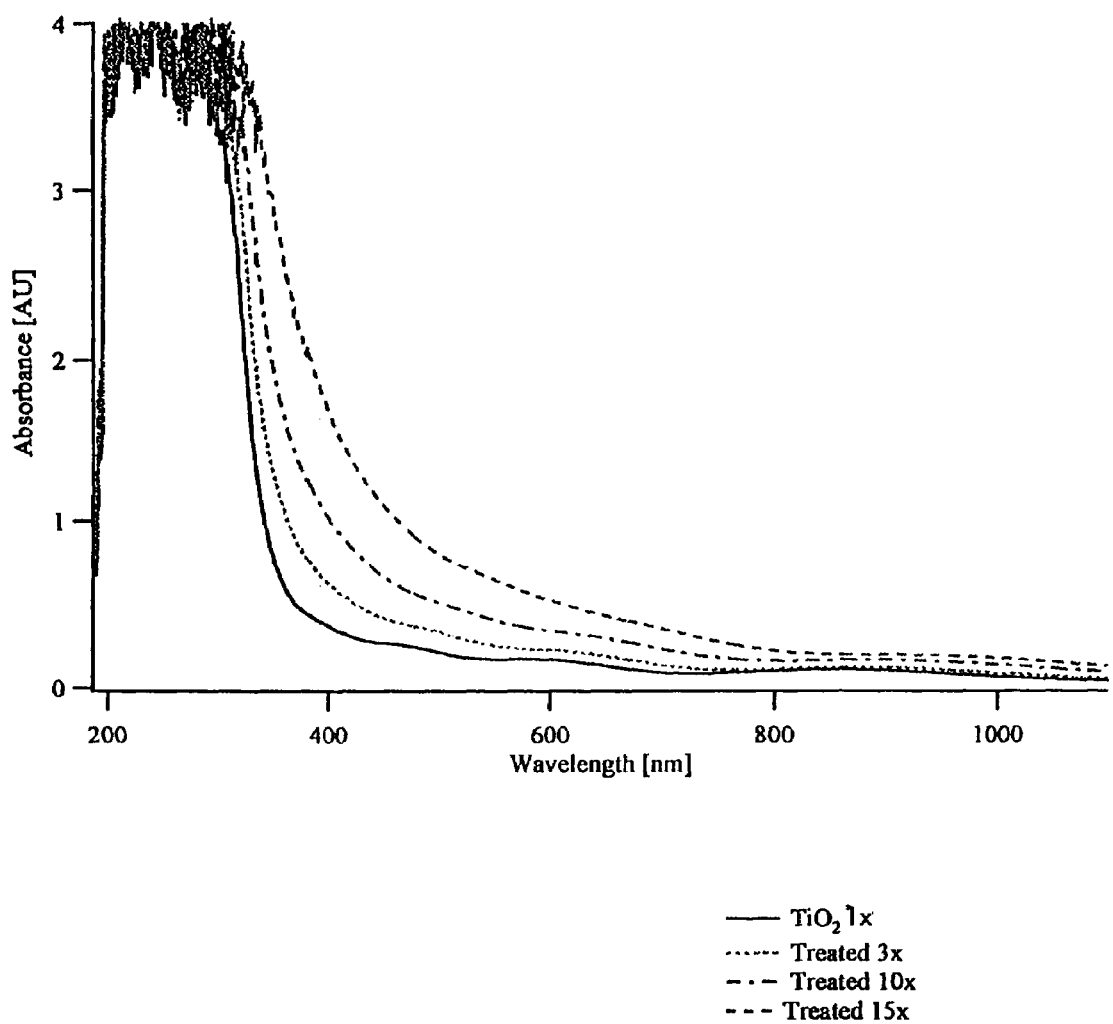
FIG. 3 shows absorption spectra of $TiO_2$ plates with different deposition treatments.

Absorption spectra are measured with a Hewlett-Packard 8453 spectrometer and are shown in FIG. 3. FIG. 3 shows that repeating the Q-dot deposition treatment results in an increase of the visible absorption of the electrode. With each deposition, the optical density increases and the electrode becomes strongly coloured. The Q-dots are getting bigger with each treatment.

Figure 4:
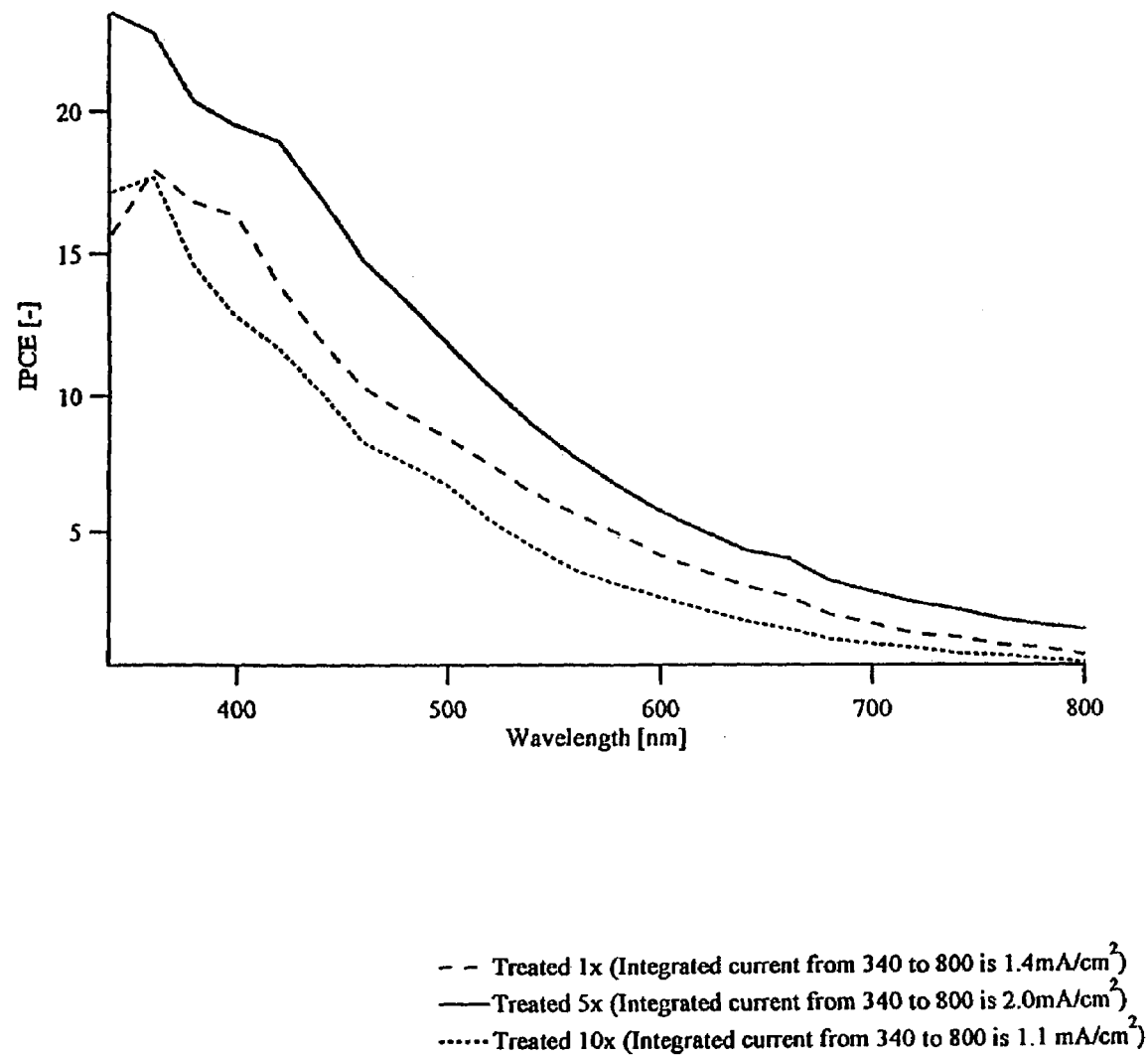
FIG. 4 shows the photo current generation efficiency as a function of wavelength for Q-dot sensitized solid state heterojunction solar cells.

FIG. 4 shows the wavelength response of the photocurrent produced by the device. The incident photon to current conversion efficiency (IPCE) is plotted as a function of the wavelength of the monochromatic light. The conversion yields are high, exceeding 10 percent in the visible. This proves that the sensitization of the heterojunction by the quantum dots functions well.

From these measurements, it can be seen that there is an optimum in the number of times the deposition treatment is repeated. For this embodiment, if only one treatment is done, there is not enough Q-dots formed on the TiO$_2$ surface. With about five treatments, PbS particles of optimal average size 5 to 7 nm are obtained. On the other hand, if there are too many deposition treatments, typically 10, as shown in FIG. 4, the Q-dots get bigger and the efficiency drops.

The invention claimed is:

1. A solid state p-n heterojunction consisting of an n-type semiconductor in the solid state, a p-type semiconductor in the solid state and a sensitizing semiconductor, said n-type semiconductor having a mesoporous structure, said sensitizing semiconductor consisting of individual particles adsorbed at the surface of said n-type semiconductor, said individual particles being quantum dots, wherein the average size of said individual particles is smaller than the average pore size of said mesoporous structure, and wherein said quantum dots are adsorbed on less than the entire surface of said n-type semiconductor, leaving said n-type semiconductor and said p-type semiconductor in direct exposure where there are no quantum dots.

2. A heterojunction as claimed in claim 1, characterised in that said n-type semiconductor is a ceramic made of finely divided large band gap metal oxide.

3. A heterojunction as claimed in claim 1, wherein said n-type semiconductor is nanocrystalline TiO$_2$.

4. A heterojunction as claimed in claim 1, wherein the average size of said individual particles of sensitizing semiconductor is of between 1 nm and 2 nm.

5. A heterojunction as claimed in claim 1, wherein the average size of said individual particles of sensitizing semiconductor is of between 1 nm and 10 nm.

6. A heterojunction as claimed in claim 1, wherein said quantum dots are particles selected from the group consisting of PbS, CdS, Bi$_2$S$_3$, Sb$_2$Sb$_3$, Ag$_2$S, InAs, InP, CdTe, CdSe, HgTe and solid solutions of HgTe/CdTe or HgSe/CdSe.

7. A heterojunction as claimed in claim 1, characterised in that said p-type semiconductor is an inorganic hole transporting solid compound.

8. A heterojunction as claimed in claim 1, characterised in that said p-type semiconductor is an amorphous reversibly oxydisable organic or organometallic compound.

9. A heterojunction as claimed in claim 1, characterised in that said p-type semiconductor is a polymer.

10. A heterojunction as claimed in claim 1, characterised in that said p-type semiconductor is selected from the group consisting of Spiro and Heterospirocompounds of general formula (I),

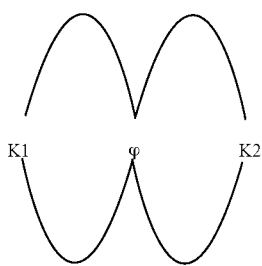 (I)

wherein φ is one of C, Si, Ge or Sn, and K1 and K2 are independently one from the other conjugated systems.

11. A heterojunction as claimed in claim 10, wherein said p-type semiconductor is OMeTAD.

12. A solid state sensitized photovoltaic cell comprising a solid state p-n heterojunction consisting of an nAype semiconductor in the solid state, a p-type semiconductor in the solid state and a sensitizing semiconductor, said n-type semiconductor having a mesoporous structure, said sensitizing semiconductor consisting of individual particles adsorbed at the surface of said n-type semiconductor, said individual particles being quantum dots, wherein the average size of said individual particles is smaller than the average pore size of said mesoporous structure.

13. A cell as claimed in claim 12, characterised in that it comprises
   a transparent first electrode,
   a said solid state p-n heterojunction,
   a second electrode, and further comprises a dense semiconductive layer between said first electrode and said solid state p-n heterojunction.

14. A cell as claimed in claim 12, characterised in that said n-type semiconductor is a ceramic made of finely divided large band gap metal oxide.

15. A cell as claimed in claim 12, characterised in that said n-type semiconductor is nanocrystalline $TiO_2$.

16. A cell as claimed in claim 12, wherein said quantum dots are particles selected from the group consisting of PbS, CdS, $Bi_2S_3$, $Sb_2S_3$, $Ag_2S$, InAs, InP, CdTe, CdSe, HgTe and solid solutions of HgTe/CdTe or HgSe/CdSe.

17. A cell as claimed in claim 12, wherein the average size of said individual particles is of between 1 nm and 20 nm.

18. A cell as claimed in claim 12, wherein the average size of said individual particles is of between 1 nm and 10 nm.

19. A cell as chained in claim 12, characterised in that said p-type semiconductor is an inorganic hole transporting solid compound.

20. A cell as claimed in claim 12, characterised in that said p-type semiconductor is a polymer.

21. A cell as claimed in claim 12, characterised in that said p-type semiconductor is an amorphous reversibly oxydisable organic or organometallic compound.

22. A cell as claimed in claim 12, characterised in that said p-type semiconductor is selected from the group consisting of Spiro and Heterospirocompounds of general formula (I),

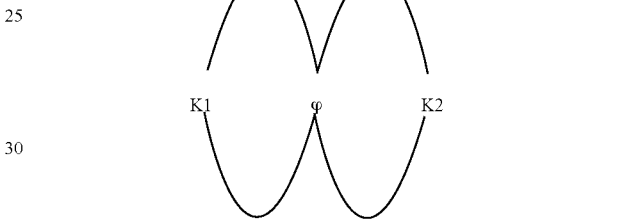 (I)

wherein φ is one of C, Si, Ge or Sn, and K1 and K2 are independently one from the other conjugated systems.

23. A cell as claimed in claim 12, wherein said p-type semiconductor is OMeTAD.

* * * * *

UNITED STATES PATENT AND TRADEMARK OFFICE
CERTIFICATE OF CORRECTION

PATENT NO.        : 7,042,029 B2
APPLICATION NO.   : 10/885224
DATED             : May 9, 2006
INVENTOR(S)       : Michael Graetzel et al.

It is certified that error appears in the above-identified patent and that said Letters Patent is hereby corrected as shown below:

Column 6, line 45:
DELETE "2 nm" AND REPLACE WITH - - 20 NM- -.

Column 6, line 52:
DELETE, | "$Bi_2\ S_3,\ Sb_2,\ Ag_2\ S$," | AND REPLACE WITH --$Bi_2S_3,\ Sb_2S_3,\ Ag_2S$,--

Column 7, line 20:
DELETE " n-Aype" AND REPLACE WITH - -ntype-semi--.

Column 8, line 3:
DELETE "$Bi_2\ S_3,\ Sb_2\ S_3,\ Ag_2\ S$," AND REPLACE WITH | -- $Bi_2S_3,\ Sb_2S_3,\ Ag_2S$,-- |

Colum 8, line 9:
DELETE "Chained" AND REPLACE WITH - - CLAIMED - -.

Signed and Sealed this

Fifth Day of September, 2006

JON W. DUDAS
*Director of the United States Patent and Trademark Office*

UNITED STATES PATENT AND TRADEMARK OFFICE
CERTIFICATE OF CORRECTION

PATENT NO. : 7,042,029 B2
APPLICATION NO. : 10/885224
DATED : May 9, 2006
INVENTOR(S) : Michael Graetzel et al.

It is certified that error appears in the above-identified patent and that said Letters Patent is hereby corrected as shown below:

Column 6, line 45:
DELETE "2 nm" AND REPLACE WITH -- 20 nm--.

Column 6, line 52:
DELETE, | "$Bi_2\ S_3$, $Sb_2\ Sb_3$, $Ag_2\ S$," | AND REPLACE WITH --$Bi_2S_3$, $Sb_2S_3$, $Ag_2S$,--

Column 7, line 20:
DELETE "nAype" AND REPLACE WITH --n-type--.

Column 8, line 3:
DELETE "$Bi_2\ S_3$, $Sb_2\ S_3$, $Ag_2\ S$," AND REPLACE WITH | -- $Bi_2S_3$, $Sb_2S_3$, $Ag_2S$,-- |

Colum 8, line 9:
DELETE "chained" AND REPLACE WITH -- claimed --.

This certificate supersedes Certificate of Correction issued September 5, 2006.

Signed and Sealed this

Twentieth Day of February, 2007

JON W. DUDAS
*Director of the United States Patent and Trademark Office*